United States Patent
Sekine et al.

(10) Patent No.: US 9,978,713 B2
(45) Date of Patent: May 22, 2018

(54) METHOD OF MANUFACTURING SEMICONDUCTOR DEVICE AND WIRE BONDING APPARATUS

(71) Applicant: SHINKAWA LTD., Tokyo (JP)

(72) Inventors: Naoki Sekine, Tokyo (JP); Motoki Nakazawa, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 2 days.

(21) Appl. No.: 15/232,828

(22) Filed: Aug. 10, 2016

(65) Prior Publication Data

US 2016/0351535 A1     Dec. 1, 2016

Related U.S. Application Data

(63) Continuation of application No. PCT/JP2015/053535, filed on Feb. 9, 2015.

(30) Foreign Application Priority Data

Feb. 10, 2014  (JP) .................. 2014-023421

(51) Int. Cl.
*B23K 31/02* (2006.01)
*H01L 23/00* (2006.01)
*B23K 20/00* (2006.01)

(52) U.S. Cl.
CPC ............ *H01L 24/85* (2013.01); *B23K 20/004* (2013.01); *H01L 24/49* (2013.01); *H01L 24/78* (2013.01);
(Continued)

(58) Field of Classification Search
CPC ......... H01L 24/85; H01L 24/49; H01L 24/78; H01L 2224/851; H01L 2224/78621;
(Continued)

(56) References Cited

U.S. PATENT DOCUMENTS 3,623,649 A * 11/1971 Keisling ............. H01L 21/4853
                                                        228/111.5
4,422,568 A * 12/1983 Elles .................... B23K 20/005
                                                        228/111
(Continued)

FOREIGN PATENT DOCUMENTS

JP          56142646 A * 11/1981  ............. H01L 24/85
JP          02028338 A *  1/1990  ............. H01L 24/78
(Continued)

OTHER PUBLICATIONS

"Written Opinion of the International Searching Authority of PCT/JP2015/053535", dated May 19, 2015, with English translation thereof, pp. 1-6.

*Primary Examiner* — Kiley Stoner
(74) *Attorney, Agent, or Firm* — JCIPRNET

(57) ABSTRACT

A method of manufacturing a semiconductor device includes: a wire tail forming step of forming a wire loop 130 between a first bonding point and a second bonding point with a bonding tool 40, and then cutting a portion of a wire 42 extending from a tip of the bonding tool 40 to thereby form a wire tail 43 at the tip of the bonding tool 40; and a wire tail bending step of bending the wire tail 43 so as to direct a tip 43a of the wire tail 43 upward by descending the bonding tool 40 toward the second bonding point with the wire loop 130 formed thereat and pressing the wire tail 43 against a portion of the wire loop 130 located above the second bonding point. Thus, the wire tail can be bent easily and efficiently.

5 Claims, 7 Drawing Sheets

(52) U.S. Cl.
CPC ........... *H01L 2224/49427* (2013.01); *H01L 2224/7855* (2013.01); *H01L 2224/7892* (2013.01); *H01L 2224/78301* (2013.01); *H01L 2224/78611* (2013.01); *H01L 2224/78621* (2013.01); *H01L 2224/851* (2013.01); *H01L 2224/85203* (2013.01); *H01L 2224/85205* (2013.01); *H01L 2924/00014* (2013.01)

(58) Field of Classification Search
CPC ... H01L 2224/7892; H01L 2224/85205; H01L 2224/85203; H01L 2224/7855; H01L 2224/78611; H01L 2924/00014; H01L 2224/49427; H01L 2224/78301; B23K 20/004; B23K 20/005; B23K 20/007
USPC ............................. 228/4.5, 180.5, 904
See application file for complete search history.

(56) References Cited

U.S. PATENT DOCUMENTS

| | | | | |
|---|---|---|---|---|
| 4,437,604 A * | 3/1984 | Razon | ............... | B23K 20/005 228/180.5 |
| 4,619,397 A * | 10/1986 | Urban | ............... | H01L 24/06 156/580.1 |
| 4,976,392 A * | 12/1990 | Smith | ............... | B23K 20/004 228/1.1 |
| 6,079,610 A * | 6/2000 | Maeda | ............... | B23K 20/005 228/110.1 |
| 6,182,885 B1 * | 2/2001 | Nishiura | ............... | B23K 20/005 228/178 |
| 2001/0020545 A1 * | 9/2001 | Eldridge | ............... | B23K 20/004 174/260 |
| 2001/0023534 A1 * | 9/2001 | Tamai | ............... | H01L 24/11 29/843 |
| 2002/0027151 A1 | 3/2002 | Arakawa | | |
| 2005/0109819 A1 * | 5/2005 | Qin | ............... | B23K 20/007 228/180.5 |
| 2006/0175383 A1 * | 8/2006 | Mii | ............... | B23K 20/004 228/180.5 |
| 2006/0255101 A1 * | 11/2006 | Shirato | ............... | B23K 20/004 228/180.5 |
| 2007/0108256 A1 * | 5/2007 | Mii | ............... | B23K 20/004 228/110.1 |
| 2007/0187138 A1 * | 8/2007 | Takahashi | ............... | H01L 24/78 174/257 |
| 2007/0187467 A1 * | 8/2007 | Toyama | ............... | H01L 24/11 228/101 |
| 2007/0246513 A1 * | 10/2007 | Tei | ............... | H01L 24/78 228/101 |
| 2008/0197510 A1 * | 8/2008 | Mii | ............... | B23K 20/004 257/780 |
| 2009/0127317 A1 * | 5/2009 | Siepe | ............... | B23K 20/004 228/110.1 |
| 2010/0230809 A1 * | 9/2010 | Calpito | ............... | H01L 21/6835 257/737 |
| 2011/0057299 A1 * | 3/2011 | Takata | ............... | B23K 20/007 257/676 |
| 2011/0180590 A1 * | 7/2011 | Akiyama | ............... | B23K 20/007 228/111 |
| 2012/0175665 A1 * | 7/2012 | Lim | ............... | H01L 24/48 257/99 |
| 2013/0119117 A1 | 5/2013 | McGrath | | |
| 2014/0138426 A1 * | 5/2014 | Hagiwara | ............... | H01L 24/78 228/160 |
| 2014/0284784 A1 * | 9/2014 | Yasunaga | ............... | H01L 23/52 257/690 |
| 2016/0351537 A1 * | 12/2016 | Sekine | ............... | H01L 24/78 |

FOREIGN PATENT DOCUMENTS

| | | | | |
|---|---|---|---|---|
| JP | 2003258041 | | 9/2003 | |
| JP | 2003318216 | | 11/2003 | |
| JP | 2006054383 A | * | 2/2006 | ............ H01L 24/85 |
| JP | 2010182779 | | 8/2010 | |

\* cited by examiner

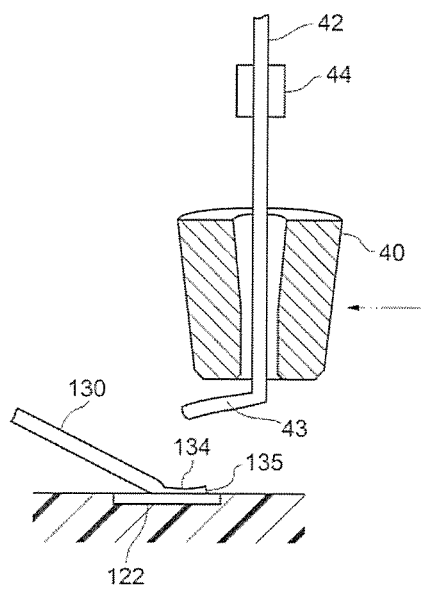
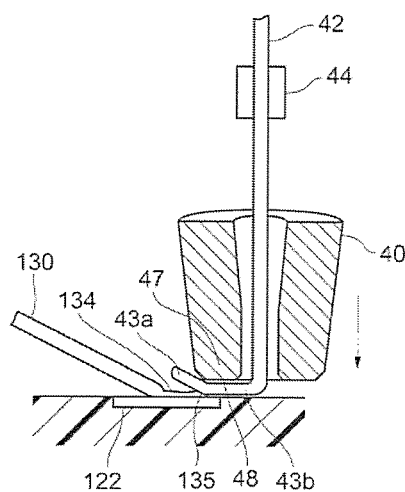
FIG. 5 (A)
FIG. 5 (B)
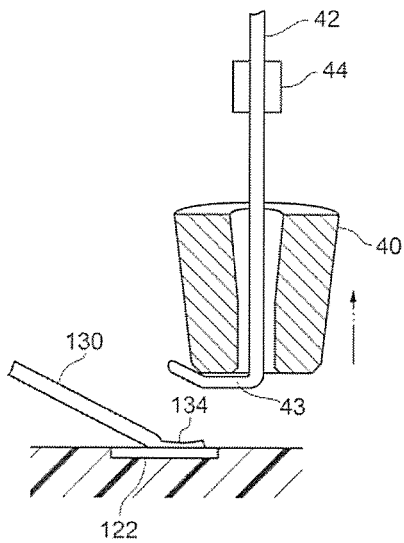
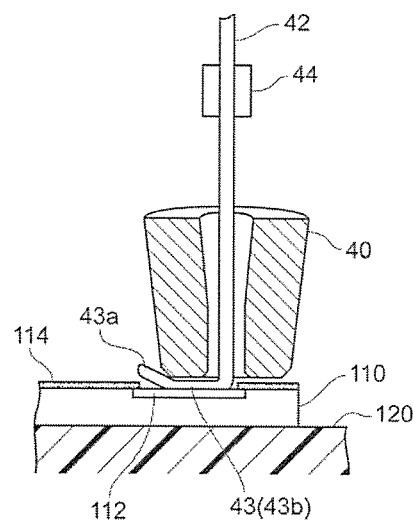
FIG. 5 (C)
FIG. 5 (D)

METHOD OF MANUFACTURING SEMICONDUCTOR DEVICE AND WIRE BONDING APPARATUS

CROSS REFERENCE TO RELATED APPLICATIONS

This application is a Continuation of PCT International Application No. PCT/JP2015/053535, filed on Feb. 9, 2015, which claims priority under 35 U.S.C. § 119(a) to Patent Application No. 2014-023421, filed in Japan on Feb. 10, 2014, all of which are hereby expressly incorporated by reference into the present application.

TECHNICAL FIELD

The present invention relates to a method of manufacturing a semiconductor device and a wire bonding apparatus.

BACKGROUND ART

In manufacturing semiconductor devices, for example, wire bonding is widely used to electrically connect electrodes on a semiconductor chip to electrodes on a substrate with wires. A wedge bonding system is known as a means of the manufacturing method of a semiconductor device. This system involves connecting a wire to a bonding target without forming any balls at the tip of the wire. In such a wedge-bonding system, the wire is connected between a first bonding point and a second bonding point. A portion of the wire extended from a tip of a bonding tool is then cut to form a wire tail at the tip end thereof for a subsequent wire bonding process. This wire tail is then bonded to the next first bonding point as it is, without performing a ball-formation step.

However, when the first bonding point is, for example, an electrode on a semiconductor chip, the tip of the wire tail bonded to the first bonding point might come into contact with an adjacent electrode or a passivation film on the semiconductor chip, thereby potentially causing damage or defect in the semiconductor chip.

To solve such problems, a method is proposed in which a member (die) for bending the tip of a wire tail in the upward direction is prepared separately from the bonding target, and then a bonding tool is moved over this member to thereby shape the wire tail before bonding to the first bonding point—as disclosed, for example, in Patent Document 1. However, the bonding tool must be moved to a position away from the bonding target every time the wire bonding is applied, which makes it difficult to achieve a simple and efficient manufacturing method. Alternatively, taking into consideration the fact that this kind of problem occurs only at the first bonding point, reverse bonding, which involves reversing the bonding order, can also be proposed to solve the problems. However, due to a limitation of the bonding order, this method does not have a high degree of flexibility in design of manufacturing methods for semiconductor devices.

CITATION LIST

Patent Document

Patent document 1: JP2003-318216A

SUMMARY OF INVENTION

Technical Problem

It is hence that the present invention provides a method of manufacturing a semiconductor device, and a wire bonding apparatus that can solve the above-mentioned problems.

Solution to Problem

A method of manufacturing a semiconductor device according to an aspect of the present invention includes the steps of: a wire tail forming step of forming a wire loop between a first bonding point and a second bonding point with a bonding tool, and then cutting a portion of a wire extending from a tip of the bonding tool to thereby form a wire tail at the tip of the bonding tool; and a wire tail bending step of bending the wire tail so as to direct a tip of the wire tail upward by descending the bonding tool toward the second bonding point with the wire loop formed thereat and then pressing the wire tail against a portion of the wire loop located above the second bonding point.

With the arrangement described above, the bonding tool is descended toward the bonded second bonding point with the wire loop formed thereat, and the wire tail is pressed against the portion of the wire loop located above the second bonding point, thereby bending the wire tail. In this way, the amount of movement of the bonding tool can be suppressed, and another member for bending the wire tail is not required, which can bend the wire tail easily and efficiently. Thus, for example, when the bonding is intended at the first bonding point in the subsequent wire bonding, the tip of the wire can be prevented from coming into contact with another adjacent element. Accordingly, this arrangement can perform the manufacturing method of the semiconductor device easily and efficiently with a high degree of flexibility in design while preventing the occurrence of damage or defect in the semiconductor device.

In the manufacturing method of the semiconductor device, in the wire tail bending step, the wire tail can be pressed against the portion of the wire loop located above the latest second bonding point.

In the manufacturing method of the semiconductor device, in the wire tail bending step, the wire tail can be pressed against a tip of the wire loop located above the second bonding point.

In the manufacturing method of the semiconductor device, in the wire tail bending step, the wire tail can be pressed against the rising portion of the wire loop located above the second bonding point.

In the manufacturing method of the semiconductor device, in the wire tail forming step, the portion of the wire can be cut by ascending the bonding tool while paying out the wire and moving the bonding tool in the direction away from the wire loop.

A wire bonding apparatus according to another aspect of the present invention is to form a wire loop between a first bonding point and a second bonding point with a bonding tool, and includes: a control unit for controlling an operation of the bonding tool, wherein the control unit is configured to execute: a step of cutting a portion of a wire extending from a tip of the bonding tool to thereby form a wire tail at the tip of the bonding tool; and a step of bending the wire tail so as to direct a tip of the wire tail upward by descending the bonding tool toward the second bonding point with the wire loop formed thereat and pressing the wire tail against a portion of the wire loop located above the second bonding point.

With the arrangement described above, the control unit of the wire bonding apparatus is configured to descend the bonding tool toward the bonded second bonding point with the wire loop formed thereat, and then press the wire tail against the portion of the wire loop located above the second bonding point, thereby bending the wire tail. In this way, the amount of movement of the bonding tool can be suppressed, and another member for bending is not required, which can provide the wire bonding apparatus capable of bending the wire tail easily and efficiently. Thus, for example, when the bonding is intended at a first bonding point in the subsequent wire bonding process, the tip of the wire can be prevented from coming into contact with another adjacent element. Accordingly, this arrangement can provide the wire bonding apparatus that performs the bonding process easily and efficiently with a high degree of flexibility in design while preventing the occurrence of damage or defect in the semiconductor device.

Advantageous Effects of the Invention

Accordingly, the present invention can bend the wire tail easily and efficiently in the wire bonding. Therefore, the present invention can provide the manufacturing method of a semiconductor device as well as the wire bonding apparatus that are capable of performing the bonding process easily and efficiently with a high degree of flexibility in design while preventing the occurrence of damage or defect in the semiconductor device.

BRIEF DESCRIPTION OF THE DRAWINGS

FIGS. 5 (A) to 5 (D) are other diagrams for explaining the manufacturing method of the semiconductor device according to the embodiment.

DESCRIPTION OF EMBODIMENTS

Figure 1:
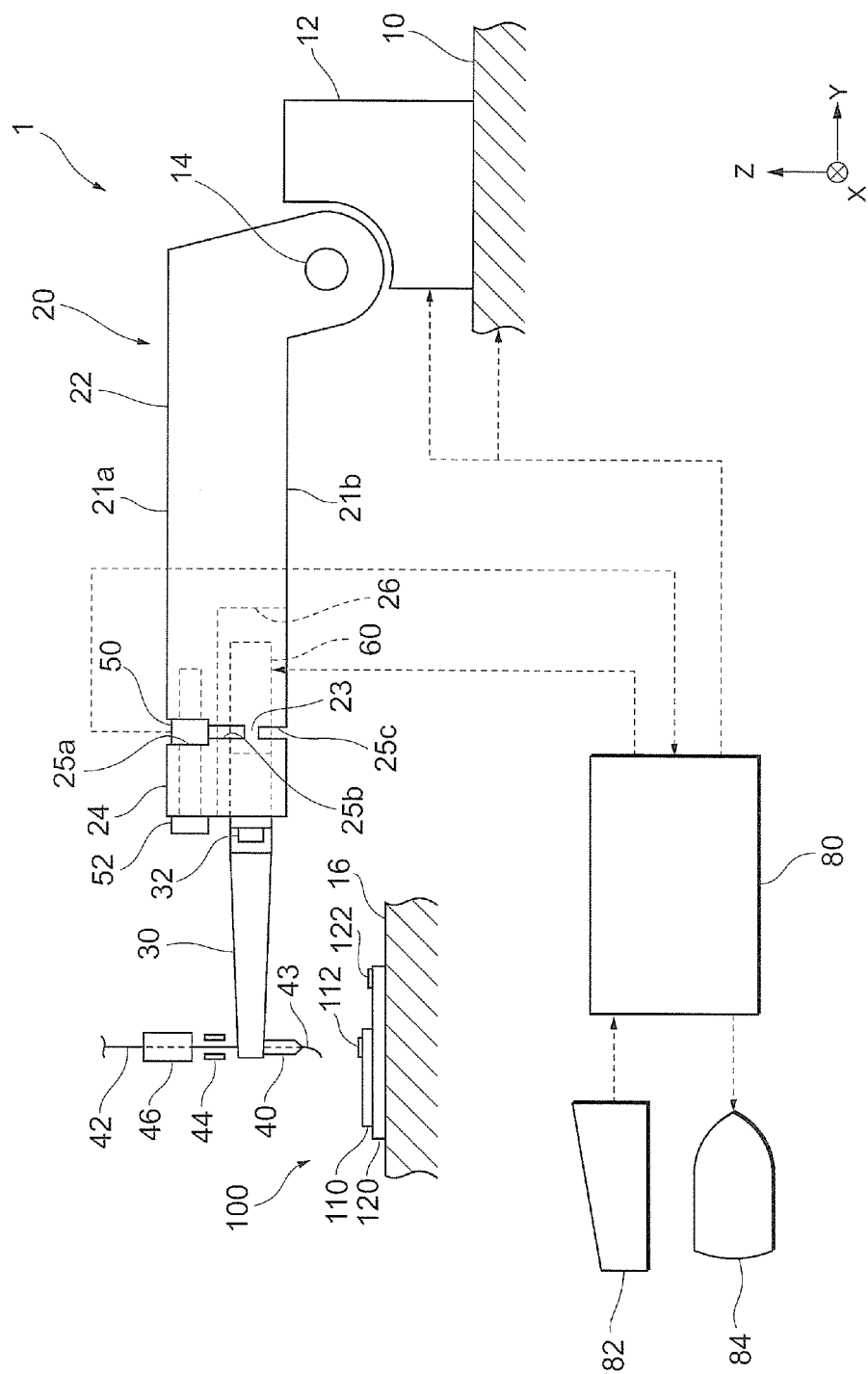
FIG. 1 is a diagram illustrating a wire bonding apparatus according to an embodiment.

Embodiments of the present invention will be described below. In the following description of the drawings, the same or similar components are designated by the same or similar reference characters. The drawings are illustrative only, the dimensions and geometries of various parts are schematic only, and the technical scope of the present invention should not be understood as being limited to the embodiments.

Figure 2:
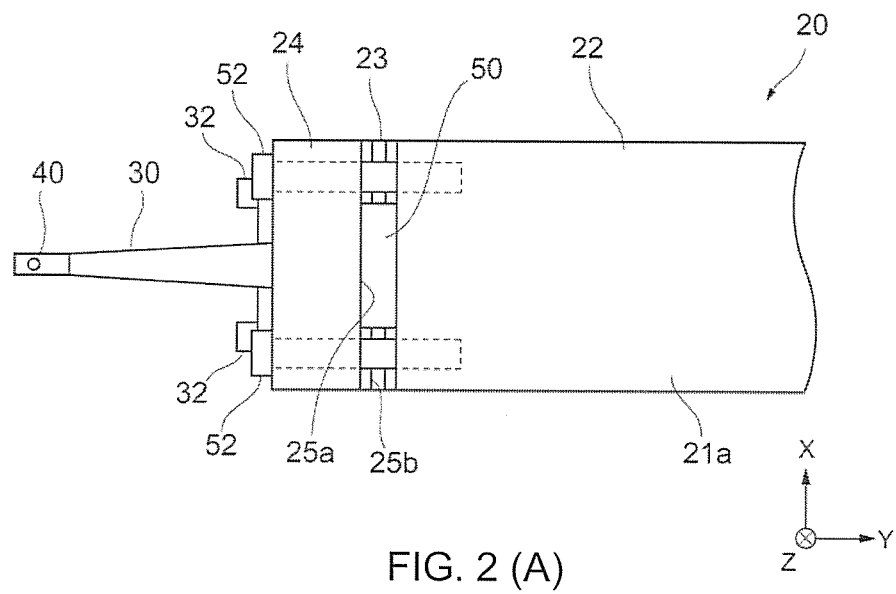
FIGS. 2 (A) and 2 (B) are top and bottom plan views in a plane of a bonding arm of the wire bonding apparatus according to the embodiment.
Figure 2:
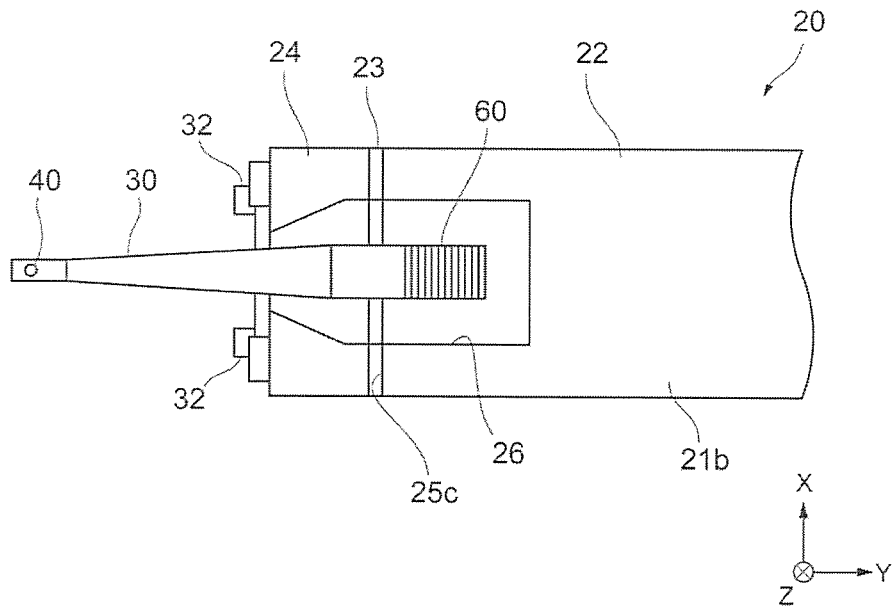

FIG. 1 illustrates a wire bonding apparatus according to an embodiment, and FIG. 2 is a partially enlarged view of a bonding arm of the wire bonding apparatus, where FIG. 2 (A) is a top plan view of the bonding arm and FIG. 2 (B) is a bottom plan view of the bonding arm.

As shown in FIG. 1, the wire bonding apparatus 1 includes an XY drive mechanism 10, a Z drive mechanism 12, a bonding arm 20, an ultrasonic horn 30, a bonding tool 40, a load sensor 50, an ultrasonic vibrator 60, and a control unit 80.

The XY drive mechanism 10 is configured to be movable in the X and Y axis directions (planar direction). The XY drive mechanism (linear motor) 10 is provided with the Z drive mechanism (linear motor) 12 capable of moving the bonding arm 20 in the Z axis direction (vertical direction).

The bonding arm 20 is supported with an arm supporting shaft 14 and configured to be swingable with respect to the XY drive mechanism 10. The bonding arm 20 is formed in a substantially rectangular parallelepiped shape so as to extend from the XY drive mechanism 10 toward a bonding stage 16 on which a bonding target 100 is placed. The bonding arm 20 includes an arm base end portion 22 attached to the XY drive mechanism 10, an arm end portion 24 positioned on the end side of the arm base end portion 22 and equipped with the ultrasonic horn 30, and a flexible connecting portion 23 connecting the arm base end portion 22 and the arm end portion 24. The connecting portion 23 is formed with slits 25a and 25b extending in a direction from a top surface 21a toward a bottom surface 21b of the bonding 20 and having a predetermined width as well as a slit 25c extending in a direction from the bottom surface 21b toward the top surface 21a of the bonding arm 20 and having a predetermined width. The connecting portion 23 is locally formed as a thin portion with the slits 25a, 25b, and 25c in this way, whereby the arm end portion 24 is flexible with respect to the arm base end portion 22.

As shown in FIGS. 1 and 2 (B), a recessed portion 26 in which the ultrasonic horn 30 is accommodated is formed at the bottom surface 21b side of the bonding arm 20. The ultrasonic horn 30 is attached to the arm end portion 24 with a horn fixing screw 32 while being accommodated in the recessed portion 26 of the bonding arm 20. The ultrasonic horn 30 has its end portion protruding from the recessed portion 26 and holding the bonding tool 40. The ultrasonic vibrator 60 for generating ultrasonic vibrations is provided in the recessed portion 26. Ultrasonic vibrations can be produced by the ultrasonic vibrator 60, transmitted to the bonding tool 40 through the ultrasonic horn 30, and imparted to the bonding target via the bonding tool 40. The ultrasonic vibrator 60 is, for example, a piezoelectric vibrator.

As shown in FIGS. 1 and 2 (A), the slits 25a and 25b are formed at the top surface 21a side of the bonding arm 20 in this order from the top surface 21a toward the bottom surface 21b. The upper slit 25a is formed more widely than the lower slit 25b. The load sensor 50 is provided in the upper slit 25a formed widely. The load sensor 50 is fixed to the arm end portion 24 with a pre-compressing screw 52. The load sensor 50 is disposed to be sandwiched between the arm base end portion 22 and the arm end portion 24. That is, the load sensor 50 is offset from the central axis in the longitudinal direction of the ultrasonic horn 30, with respect to the bonding target in a contact/separate direction. Further, the load sensor 50 is attached between the rotational center of the bonding arm 20 and an attachment surface of the arm end portion 24 to the ultrasonic horn 30 (i.e., the end surface on the bonding tool 40 side of the arm end portion 24). As mentioned above, the ultrasonic horn 30 for holding the bonding tool 40 is attached to the arm end portion 24. Once a load is applied to the tip of the bonding tool 40 due to a reaction force from the bonding target, the arm end portion 24 is bent relative to the arm base end portion 22, which allows the load sensor 50 to detect the load. The load sensor 50 is, for example, a piezoelectric load sensor.

Figure 4:
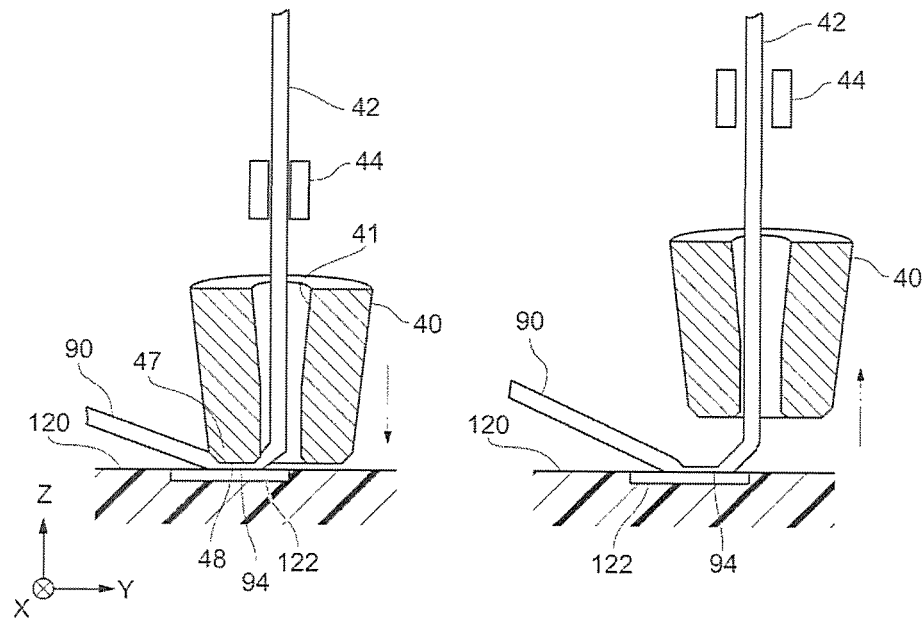
FIGS. 4 (A) to 4 (C) are diagrams for explaining the manufacturing method of the semiconductor device according to the embodiment.
Figure 4:
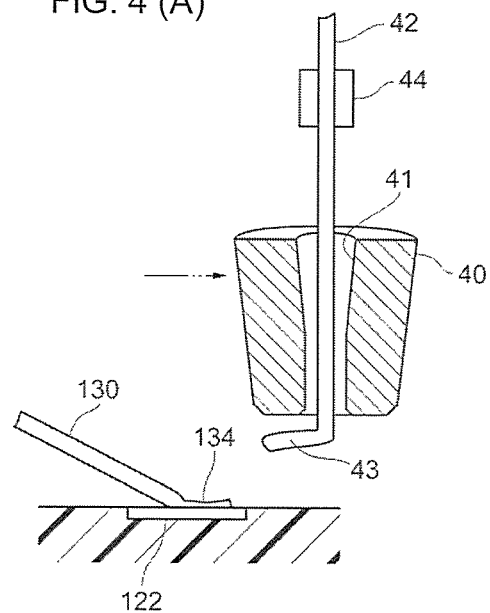

The bonding tool 40 is to guide a wire 42, and for example, is a capillary with an insertion hole 41 formed therein (see FIG. 4(A)). In this case, the wire 42 to be used for bonding is inserted into the insertion hole 41 of the bonding tool 40, whereby a portion of the wire 42 can be paid out of the tip of the bonding tool. A pressing portion 47 for pressing the wire 42 is provided at the tip of the bonding tool 40 (see FIG. 4(A)). The pressing portion 47 is rotationally symmetric about the axis of the insertion hole 41 of the bonding tool 40 and has a pressing surface 48 at its lower surface around the insertion hole 41.

The bonding tool 40 is attached to the ultrasonic horn 30 in such a manner as to be replaceable by the use of a spring force and the like. A wire clamper 44 is provided above the bonding tool 40. The wire clamper 44 is configured to hold or release the wire 42 at a predetermined timing. Further, a wire tensioner 46 is provided above the wire clamper 44. The wire 42 is inserted into and passes through the wire tensioner 46, so that the wire tensioner 46 applies adequate tension to the wire 42 during the bonding.

Materials suitable for use in the wire 42 are selected in terms of the workability, the low electric resistance, and the like as appropriate, and can include, for example, gold (Au), aluminum (Al), copper (Cu), silver (Ag), etc. A portion 43 of the wire 42 extending from the tip of the bonding tool 40 is bonded at a first bonding point.

Returning to FIG. 1, the control unit 80 is connected to the XY drive mechanism 10, the Z drive mechanism 12, the ultrasonic horn 30 (ultrasonic vibrator 60), and the load sensor 50. The control unit 80 can control the operations of these components to perform necessary processing for the wire bonding. The control unit 80 includes interfaces (not shown) for transmitting and receiving signals to/from respective components such as the XY drive mechanism 10, the Z drive mechanism 12, the load sensor 50, the ultrasonic horn 30 (ultrasonic vibrator 60), and the wire clamper 44. Specifically, the control unit 80 performs the control of the operation of the bonding tool, including control of a moving distance in the X, Y, and Z-axis directions and a load in the Z direction of the bonding tool 40, an opening and closing operation of the wire clamper 44, the timing, duration, and scrubbing operations of ultrasonic vibrations to be given to the bonding tool 40.

The control unit 80 is connected to an operation unit 82 for inputting control information, and a display unit 84 for outputting control information, so that an operator can input necessary control information by the operation unit 82 while recognizing it on a screen of the display unit 84. The control unit 80 is a computing device including, for example, a CPU and a memory. Bonding programs and the like for performing necessary processing for the wire bonding are previously stored in the memory. The control unit 80 includes means for performing respective processing (programs for causing the computer to execute the respective processing) that involve controlling the operation of the bonding tool 40 in a manufacturing method of the semiconductor device to be described later.

Next, the manufacturing method of the semiconductor device according to this embodiment will be described with reference to FIGS. 3 to 6. The manufacturing method of the semiconductor device is performed using the above-mentioned wire bonding apparatus 1.

Figure 3:
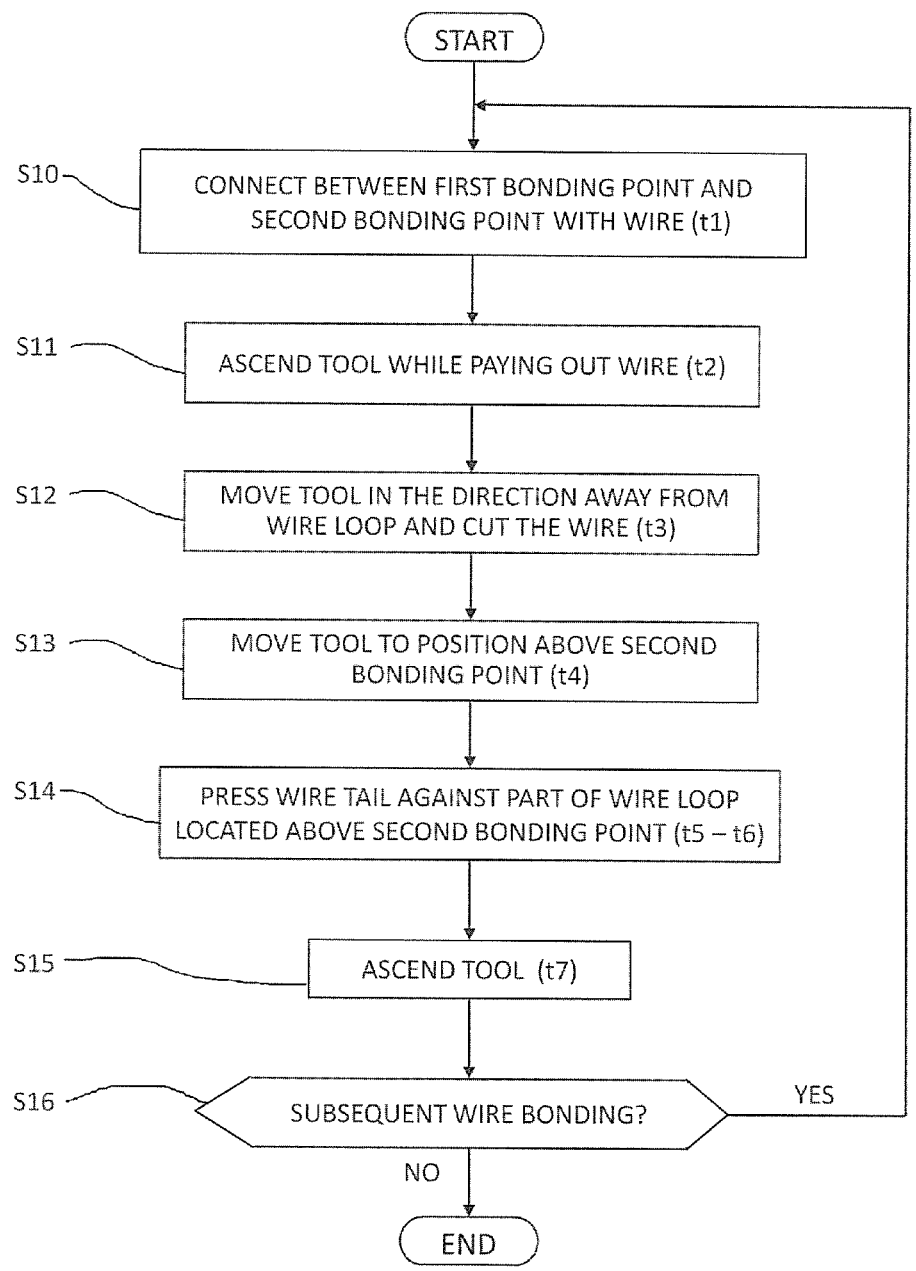
FIG. 3 is a flow chart of a manufacturing method of a semiconductor device according to the embodiment.
Figure 6:
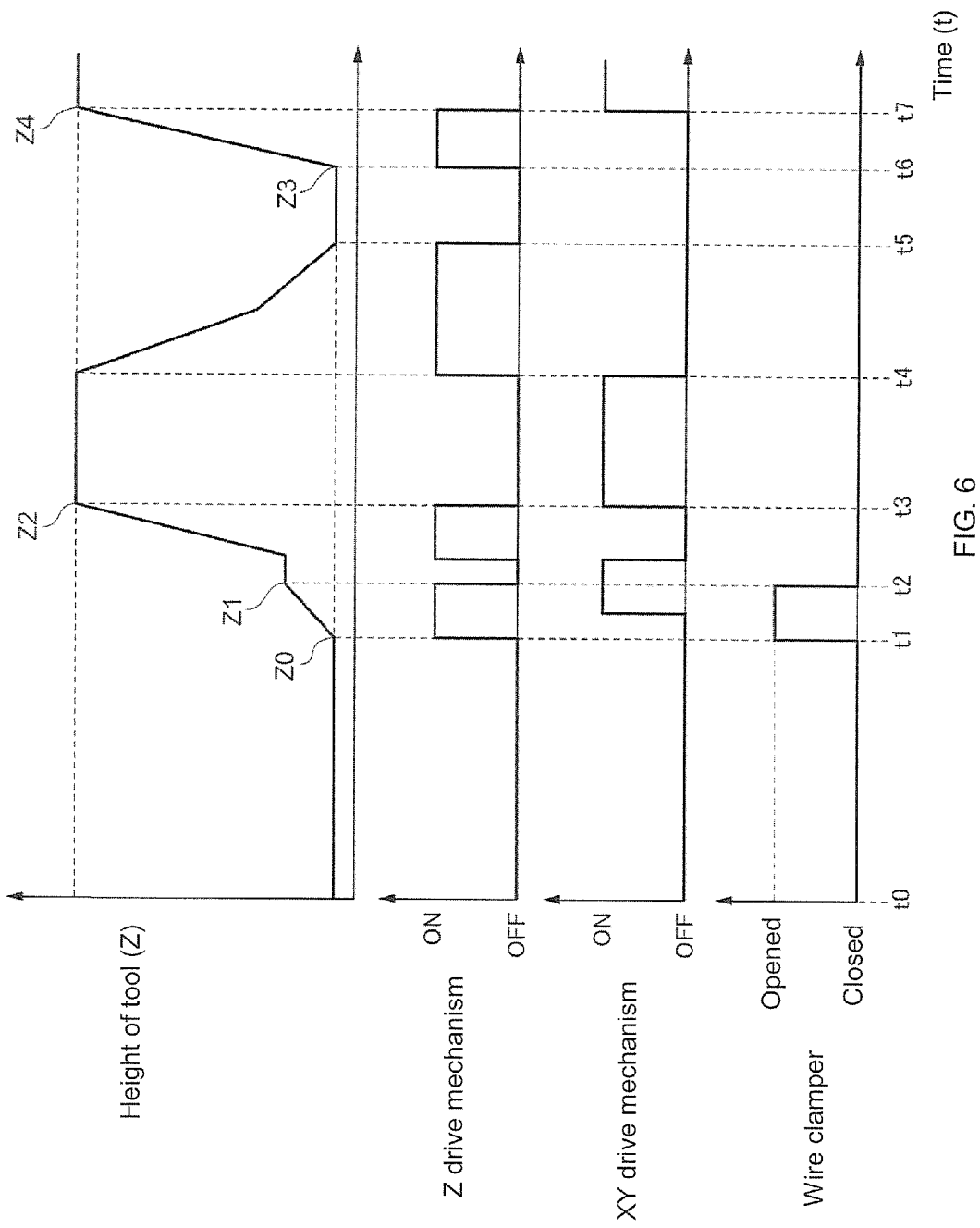
FIG. 6 is a timing chart regarding the manufacturing method of the semiconductor device according to the embodiment.

Here, FIG. 3 is a flow chart showing the manufacturing method of the semiconductor device, and FIGS. 4(A) to 4(C) and FIGS. 5(A) to 5(D) illustrate the wire bonding process. FIG. 6 is a timing chart regarding the manufacturing method of the semiconductor device. The X, Y, and Z-axis directions shown in FIG. 4(A) can be applied to FIGS. 4(B) and 4(C), FIGS. 5(A) to 5(D), and FIG. 6.

First, a bonding target 100 is prepared on the bonding stage 16.

As shown in FIG. 1, the bonding target 100 has a first bonding point and a second bonding point, which are electrically connected by the manufacturing method of the semiconductor device in this embodiment. Here, the first bonding point indicates a first-bonded one of two points connected together with the wire, while the second bonding point indicates the other of these two points that is bonded after the first bonding point.

The bonding target 100 is a semiconductor device including at least one semiconductor chip, and, for example, as shown in FIG. 1, includes a semiconductor chip 110 with a plurality of electrodes 112 as the first bonding points, and a substrate 120 with a plurality of electrodes 122 as the second bonding points. A passivation film 114 (not shown in FIG. 1 but see FIG. 5(D)) is formed as a protective film at the surface of the semiconductor chip 110 with the electrodes 112 formed thereat (the surface where the semiconductor element is formed). The plurality of electrodes 112 is exposed from respective openings of the passivation film 114. The semiconductor chip 110 is mounted on the substrate 120. In such a form, bonding the wire to the electrode 112 on the semiconductor chip 110 and to the electrode 122 on the substrate 120 in this order is normally called "forward bonding". Although in examples below, the forward bonding will be described by way of example, the wire bonding in this embodiment can be applied to the so-called "reverse bonding" which involves bonding a wire to the electrode 122 on the substrate 120 and to the electrode 112 on the semiconductor chip 110 in that order.

<Processing Before a Time t0 and in a Period from the Time t0 to a Time t1>

As shown in FIG. 3, the electrode 112 on the semiconductor chip 110 as the first bonding point and the electrode 122 on the substrate 120 as the second bonding point are connected together with a wire (in S10).

Specifically, as shown in FIG. 1, a portion of the wire (wire tail) hanging from the tip of the bonding tool 40 is bonded to the electrode 112 (first bonding point) on the semiconductor chip 110. Then, the bonding tool 40 is moved over to a position above the electrode 122 of the substrate 120 (second bonding point) along a predetermined trajectory while paying out the wire from the tip of the bonding tool 40, and at that time, the bonding tool 40 is descended. Then, in a period from a time t0 to a time t1 as shown in FIG. 6, the bonding tool 40 is pressurized at a height Z0 with the wire clamper 44 closed, thereby bonding a portion 94 of the wire 42 to the electrode 122 on the substrate 120 as shown in FIG. 4(A). Specifically, the portion 94 of the wire 42 is pressurized with the pressing portion 47 (pressing surface 48) of the bonding tool 40, and then heat, ultrasound waves, and/or the scrub operation are applied thereto, whereby the wire and the electrode are bonded together. In this way, a wire loop 90 is formed to connect both the electrode 112 as the first bonding point and the electrode 122 as the second bonding point.

<Processing in a Period from the Time t1 to a Time t3>

After bonding at the second bonding point, the bonding tool 40 is ascended to a height Z1 while paying out the wire 42 (in S11). For example, as shown in FIG. 6, at the time t1, the Z drive mechanism 12 is operated to make the bonding tool 40 ascend, and then the XY drive mechanism 10 is operated to move the bonding tool 40 in the direction (Y direction) away from the wire loop 90. During this time, as shown in FIG. 6, the wire clamper 44 is opened. In this way, the wire 42 is paid out of the tip of the bonding tool 40 by a predetermined amount corresponding to the amount of movement of the bonding tool 40. Thus, at the time t2, as shown in FIG. 4(B), the wire 42 is extended by a predetermined length from the tip of the bonding tool 40 to the second bonding point.

Thereafter, as shown in FIG. 3, the bonding tool 40 is further moved in the direction (Y direction) away from the wire loop 90, and then the wire 42 is cut (in S12). Specifically, as shown in FIG. 6, at the time t2, the XY drive mechanism 10 is further operated with the wire clamper 44 closed to move the bonding tool 40 in the direction away from the wire loop 90. Thereafter, the Z drive mechanism 12 is operated to ascend the bonding tool 40 to a height Z2 at the time t3 as shown in FIG. 4(C). At any timing during the period from the time t2 to the time 3, a tensile stress is applied to the wire 42 to cut a portion of the wire 42, thereby forming a wire tail 43 at the tip of the bonding tool 40. Since the bonding tool 40 is moved in the direction away from the wire loop 90 to thereby cut the wire 42, as shown in FIG. 4(C), the wire tail 43 is bent in a direction intersecting the Z direction along the moving direction of the bonding tool 40. For example, the bonding tool 40 can be moved on the straight line in the Y direction that connects the first bonding point to the second bonding point, thus extending the wire tail 43 such that it is bent in this Y direction. The timing at which the wire 42 is cut is not specifically limited. However, for example, as shown in FIG. 6, while the XY drive mechanism 10 is in operation after the time t2, the wire 42 can be cut. Alternatively, while the bonding tool 40 is ascending by the operation of the Z drive mechanism 12 after the operation of the XY drive mechanism 10 stops, the wire 42 can be cut.

By such processing, as shown in FIG. 4(C), a wire loop 130 can be formed to extend in a predetermined shape that connects between the first bonding point and the second bonding point. The wire loop 130 has a bonded portion 134 on the electrode 122 as the second bonding point. The bonded portion 134 is flexibly deformed to become thinner (by about one third) than the diameter of the wire by the bonding with the bonding tool 40.

<Processing in a Period from the Time t3 to a Time t6>

After forming the wire tail 43, the bonding tool 40 is moved to the position above the second bonding point already bonded (in S13). Specifically, as shown in FIG. 6, the XY drive mechanism 10 is operated to move the bonding tool 40 over a period from the time t3 to a time t4. Then, at a time t4, the wire tail 43 is positioned above the second bonding point as shown in FIG. 5(A). When a plurality of second bonding points bonded is present on the substrate 120, the bonding tool 40 is preferably moved to the latest second bonding point. With this arrangement, the amount of movement of the bonding tool 40 can be minimized, and the extending direction of the wire tail 43 is substantially aligned with the extending direction of the wire loop 130 at the second bonding point, which can eliminate the necessity of adjusting the direction of the bonding tool 40, thereby easily bending the wire tail 43 to be described later.

Next, as shown in FIG. 3, the wire tail 43 is pressed against the portion of the wire loop 130 located above the second bonding point (in S14). Specifically, during a period from the time t4 to a time t5 as shown in FIG. 6, the Z drive mechanism 12 is operated to descend the bonding tool 40 toward the second bonding point. Then, during a period from the time t5 to the time 6, the wire tail 43 is pressed against the portion of the wire loop 130 to thereby pressurize the bonding tool 40 at a height Z3.

For example, as shown in FIG. 5(B), the wire tail 43 can be pressed against the bonded portion (stitch) 134 of the wire loop 130 located above the second bonding point (specifically, an end 135 of the bonded portion 134). The end 135 located above the second bonding point is protruded from the surface of the electrode 122 (or the surface of the substrate 120) (to form a stepped portion). The wire tail 43 is pressed against the end 135 of the wire loop 130, whereby the wire tail 43 can be bent in such a manner as to direct an end 43a of the wire tail 43 upward with the end 135 serving as the starting point. A portion 43b of the wire tail except for the end 43a can be processed to extend in the direction substantially in parallel with the XY plane by being pressed by means of the pressing portion 47 (pressing surface 48) of the bonding tool 40. In this way, the wire tail 43 can be processed such that it has the end 43a extending obliquely upward relative to the XY plane, and that the portion 43b except for the end 43a extends substantially in parallel with the XY plane.

<Processing in a Period from the Time t6 to a Time t7 and after the Time t7>

Then, in a period from the time t6 to a time t7 as shown in FIG. 6, the Z drive mechanism 12 is operated to raise the bonding tool 40 up to a height Z4 (in S15). In this way, at the time t7 as shown in FIG. 5(C), while the wire loop 130 is formed to connect the first bonding point and the second bonding point, the wire tail 43 can be formed to have its part at the tip of the bonding tool 40 bent in the predetermined shape. Thereafter, as shown in FIG. 3, it is determined whether a subsequent wire bonding process is necessary or not on the bonding target 100 (in S16). If the subsequent wire bonding process is determined to be necessary (if Yes in S16), the bonding tool 40 is moved to the first bonding point for the subsequent wire bonding process, the wire tail 43 is bonded to the first bonding point, and then the operation repeatedly performs a series of steps S10 to S15. On the other hand, if the subsequent wire bonding process is determined not to be necessary, and the wire bonding for the bonding target 100 is all finished (if No in S16), then the wire bonding process for the bonding target 100 is terminated.

When the subsequent wire bonding is performed (if Yes in S16), after the time t7 as shown in FIG. 6, the XY drive mechanism 10 is operated to move the bonding tool 40 to a position above a next first bonding point. Then, the bonding tool 40 is descended toward the electrode 112 of the semiconductor chip 110 as the first bonding point, and then as shown in FIG. 5(D), the wire tail 43 extending from the tip of the bonding tool 40 is bonded to the electrode 112. Here, the semiconductor chip 110 is mounted on the substrate 120, and the passivation film 114 is formed as the protective film at the surface of the semiconductor chip 110 with the electrodes 112 formed thereat (the surface where the semiconductor element is formed). The portion of the wire tail 43 (a portion 43b except for the end) is bonded to an exposure region of the electrode 122 from the opening of the passivation film 114. The end 43a of the wire tail 43 can be extended obliquely upward relative to the XY plane, thereby preventing the contact of the wire tail 43 with other adjacent elements (e.g., the passivation film 114, adjacent another electrode, or the like).

As mentioned above, according to this embodiment, the bonding tool 40 is descended toward the second bonding point (electrode 122) with the bonded wire loop 130 formed thereat, and then the wire tail 43 is pressed against the portion of the wire loop 130 located above the second bonding point, whereby the wire tail 43 is bent. This arrangement suppresses the amount of movement of the bonding tool 40 and does not require another member for bending a wire tail, and thereby can bend the wire tail easily and efficiently. Thus, for example, when the bonding is intended at a first bonding point in the subsequent wire bonding process, the tip of the wire can be prevented from coming into contact with another adjacent element. Accordingly, this arrangement can perform the bonding process easily and efficiently with a high degree of flexibility in design while preventing the damage or defect in the semiconductor device.

The present invention is not limited to the embodiments described above, and various modifications can be made to these embodiments.

Figure 7:
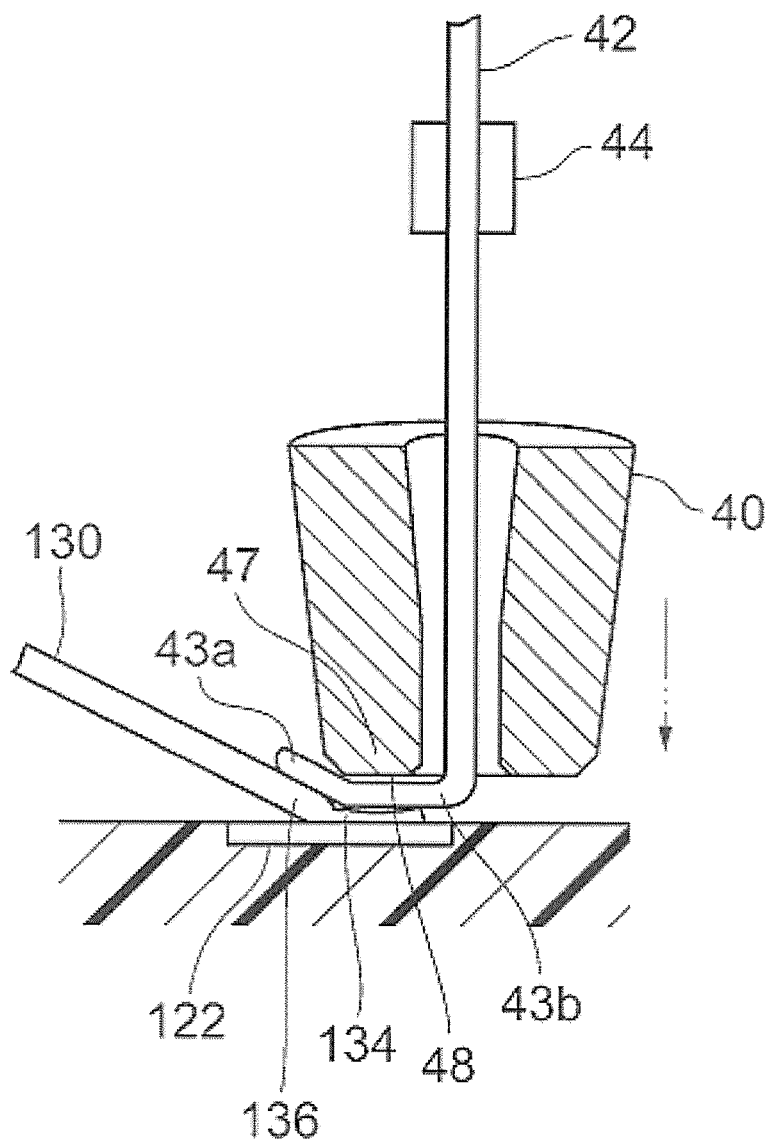
FIG. 7 is a diagram for explaining a manufacturing method of a semiconductor device according to a modified example of the embodiment.

Although in the above-mentioned embodiment, as shown in FIG. 5(B), the wire tail 43 is pressed against the tip 135 of the wire loop 130 (of bonded portion 134) located above the second bonding point by way of example, the invention is not limited to this embodiment. For example, as shown in FIG. 7, the wire tail 43 can be pressed against a rising portion 136 of the wire loop 130 located above the second bonding point. The rising portion 136 located above the second bonding point is protruded from the bonded portion 134 of the wire loop 130 (to form a stepped portion), whereby also in this case, the wire tail 43 can be bent with its tip 43*a* of the wire tail 43 directed upward, while the rising portion 136 of the wire loop 130 serves as the starting point.

The movements in the X, Y, and Z directions of the bonding tool 40 are not limited to the structures described in the above embodiment by way of example, and can include, for example, processes for drawing not only a straight trajectory but also a curved trajectory. Further, the shape of the bonding tool 40 is not limited to that shown in the figure.

The examples and application examples that have been described above through the embodiments of the invention can be combined as appropriate and changed or modified depending on the applications. Therefore, the present invention is not limited to the description of the embodiments above. It is obvious from the accompanying claims that such combinations, changes or modifications of the embodiments can be included in the technical scope of the present invention.

The invention claimed is:

1. A method of manufacturing a semiconductor device, comprising:
    a wire tail forming step of forming a wire loop between a first bonding point and a second bonding point with a bonding tool, and then cutting a portion of a wire extending from a tip of the bonding tool, to thereby form a wire tail at the tip of the bonding tool; and
    a wire tail bending step of bending the wire tail so as to direct a tip of the wire tail upward by descending the bonding tool toward the second bonding point with the wire loop formed thereat and pressing the wire tail against a portion of the wire loop located above the second bonding point.

2. The method of manufacturing a semiconductor device according to claim 1, wherein
    in the wire tail bending step, the wire tail is pressed against the portion of the wire loop located above the latest second bonding point.

3. The method of manufacturing a semiconductor device according to claim 1, wherein
    in the wire tail bending step, the wire tail is pressed against a tip of the wire loop located above the second bonding point.

4. The method of manufacturing a semiconductor device according to claim 1, wherein
    in the wire tail bending step, the wire tail is pressed against a rising portion of the wire loop located above the second bonding point.

5. The method of manufacturing a semiconductor device according to claim 1, wherein
    in the wire tail forming step, the portion of the wire is cut by ascending the bonding tool while paying out the wire and moving the bonding tool in a direction away from the wire loop.

* * * * *